United States Patent
Yang et al.

(10) Patent No.: US 12,484,416 B2
(45) Date of Patent: Nov. 25, 2025

(54) LIGHT-EMITTING SUBSTRATE AND LIGHT-EMITTING APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chao Yang, Beijing (CN); Pohsien Wu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 492 days.

(21) Appl. No.: 17/921,001

(22) PCT Filed: Nov. 23, 2021

(86) PCT No.: PCT/CN2021/132276
§ 371 (c)(1),
(2) Date: Oct. 24, 2022

(87) PCT Pub. No.: WO2022/217919
PCT Pub. Date: Oct. 20, 2022

(65) Prior Publication Data
US 2023/0165111 A1 May 25, 2023

(30) Foreign Application Priority Data
Apr. 16, 2021 (CN) .......................... 202110412804.2

(51) Int. Cl.
*H10K 59/82* (2023.01)

(52) U.S. Cl.
CPC .................................... *H10K 59/82* (2023.02)

(58) Field of Classification Search
CPC .... H10K 59/82; H10K 59/179; H10K 59/805; H10K 59/1795; H10K 59/00; H10K 50/805
See application file for complete search history.

(56) References Cited

U.S. PATENT DOCUMENTS 7,161,184 B2 * 1/2007 Miyagi ................. H10K 50/82
257/89
10,181,573 B2 * 1/2019 Im ....................... H10K 50/805
(Continued)

FOREIGN PATENT DOCUMENTS

CN       106463646 A    2/2017
CN       109742106 A    5/2019
(Continued)

OTHER PUBLICATIONS

Office Action issued on Nov. 29, 2024, in corresponding Chinese patent Application No. 202110412804.2, 29 pages.

*Primary Examiner* — Bitew A Dinke
(74) *Attorney, Agent, or Firm* — XSENSUS LLP

(57) ABSTRACT

A light-emitting substrate includes a substrate, a plurality of power supply lines disposed on the substrate, a plurality of light-emitting devices disposed on the substrate and a plurality of resistance lines disposed on the substrate. Each light-emitting device includes, in a direction perpendicular to the substrate, a first electrode and a second electrode that are disposed sequentially, and a light-emitting functional layer disposed between the first electrode and the second electrode. The first electrode is closer to the substrate than the second electrode. An end of each resistance line is coupled to a power supply line, and another end of each resistance line is coupled to a first electrode of a light- (Continued)

emitting device. Each resistance line and the first electrode coupled thereto are disposed in a same layer.

18 Claims, 7 Drawing Sheets

(56) References Cited

U.S. PATENT DOCUMENTS

| | | | | |
|---|---|---|---|---|
| 2003/0146695 | A1* | 8/2003 | Seki | H10K 50/865 |
| | | | | 313/506 |
| 2008/0191603 | A1* | 8/2008 | Kubota | H10K 50/824 |
| | | | | 313/498 |
| 2008/0272992 | A1* | 11/2008 | Kwak | H10K 50/824 |
| | | | | 345/76 |
| 2009/0315450 | A1* | 12/2009 | Kim | H10K 50/846 |
| | | | | 445/24 |
| 2010/0102335 | A1* | 4/2010 | Takagi | H10K 59/80522 |
| | | | | 257/40 |
| 2012/0068593 | A1* | 3/2012 | Wang | H10K 50/81 |
| | | | | 313/498 |
| 2013/0099218 | A1* | 4/2013 | Lee | H10K 50/11 |
| | | | | 438/22 |
| 2013/0240856 | A1* | 9/2013 | Ikeda | H10K 50/81 |
| | | | | 257/40 |
| 2016/0149156 | A1* | 5/2016 | Kim | H10K 59/121 |
| | | | | 438/46 |
| 2017/0005150 | A1* | 1/2017 | Yeo | H10K 59/1315 |
| 2017/0084870 | A1* | 3/2017 | Choi | H10K 59/80518 |
| 2019/0165084 | A1* | 5/2019 | Park | H10K 59/1315 |
| 2020/0212116 | A1* | 7/2020 | Kim | G06F 3/04166 |
| 2020/0212123 | A1* | 7/2020 | Lim | H10K 50/17 |
| 2020/0227498 | A1* | 7/2020 | Cheng | H10K 59/123 |
| 2020/0321550 | A1* | 10/2020 | Hu | H10K 50/828 |
| 2021/0066267 | A1* | 3/2021 | Li | H10D 86/451 |
| 2021/0126081 | A1* | 4/2021 | Moon | H10K 59/122 |
| 2022/0173156 | A1* | 6/2022 | Park | H10H 20/831 |
| 2022/0328558 | A1* | 10/2022 | Kim | H10H 20/821 |
| 2023/0165111 | A1* | 5/2023 | Yang | H10K 59/82 |
| | | | | 257/40 |
| 2024/0186473 | A1* | 6/2024 | Eom | H10H 29/39 |

FOREIGN PATENT DOCUMENTS

| | | |
|---|---|---|
| CN | 112864218 A | 5/2021 |
| CN | 215834529 U | 2/2022 |
| JP | 2001-196191 A | 7/2001 |
| JP | 2004-101945 A | 4/2004 |
| JP | 2005-202285 A | 7/2005 |
| WO | 2012/032661 A1 | 3/2012 |

* cited by examiner

LIGHT-EMITTING SUBSTRATE AND LIGHT-EMITTING APPARATUS

CROSS-REFERENCE TO RELATED APPLICATIONS

This application is a national phase entry under 35 USC 371 of International Patent Application No. PCT/CN2021/132276, filed on Nov. 23, 2021, which claims priority to Chinese Patent Application No. 202110412804.2, filed on Apr. 16, 2021, which are incorporated herein by reference in their entirety.

TECHNICAL FIELD

The present disclosure relates to the field of display technologies, and in particular, to a light-emitting substrate and a light-emitting apparatus.

BACKGROUND

When a self-luminous device, especially an organic light-emitting diode (OLED), is used for lighting, a significant advantage is that a large-sized surface light source with any shape may be achieved.

SUMMARY

In an aspect, a light-emitting substrate is provided. The light-emitting substrate includes a substrate, a plurality of power supply lines disposed on the substrate, a plurality of light-emitting devices disposed on the substrate and a plurality of resistance lines disposed on the substrate. Each light-emitting device includes, in a direction perpendicular to the substrate, a first electrode and a second electrode that are disposed sequentially, and a light-emitting functional layer disposed between the first electrode and the second electrode. The first electrode is closer to the substrate than the second electrode. An end of each resistance line is coupled to a power supply line, another end of each resistance line is coupled to a first electrode of a light-emitting device, and each resistance line and the first electrode coupled thereto are disposed in a same layer.

In some embodiments, the plurality of light-emitting devices include a plurality of lines of light-emitting devices arranged in a first direction, and light-emitting devices in each line of light-emitting devices are arranged in a second direction; the first direction intersects the second direction. The plurality of power supply lines include a first power supply line and a second power supply line that extend in the second direction and are arranged adjacent to each other in the first direction. The first power supply line and the second power supply line are provided with at least one line of light-emitting devices therebetween, and a first electrode of each light-emitting device in the at least one line of light-emitting devices is coupled to the first power supply line or the second power supply line.

In some embodiments, the plurality of light-emitting devices include a first light-emitting device and a second light-emitting device that are adjacent in the first direction or in the second direction. The plurality of resistance lines include a first resistance line and a second resistance line; the first resistance line is coupled to a first electrode of the first light-emitting device, and the second resistance line bypasses at least one edge of the first electrode of the first light-emitting device and is coupled to a first electrode of the second light-emitting device.

In some embodiments, the second resistance line is adjacent to the first electrode of the first light-emitting device.

In some embodiments, the first light-emitting device and the second light-emitting device are located between the first power supply line and the second power supply line; and the first power supply line, the first light-emitting device, the second light-emitting device and the second power supply line are sequentially arranged in the first direction. The first electrode of the first light-emitting device is coupled to the second power supply line through the first resistance line, the first electrode of the second light-emitting device is coupled to the first power supply line through the second resistance line, and the first resistance line bypasses at least one edge of the first electrode of the second light-emitting device and is coupled to the first electrode of the first light-emitting device.

In some embodiments, at least a part of the first resistance line and at least a part of the second resistance line are distributed on two opposite sides, arranged in the second direction, of a group of the first electrode of the first light-emitting device and the first electrode of the second light-emitting device.

In some embodiments, an end of the first resistance line coupled to the first electrode of the first light-emitting device extends to an edge of the first electrode of the first light-emitting device proximate to the first power supply line; and/or, an end of the second resistance line coupled to the first electrode of the second light-emitting device extends to an edge of the first electrode of the second light-emitting device proximate to the second power supply line.

In some embodiments, the first power supply line includes a first coupling portion. The first light-emitting device and the second light-emitting device are arranged in the second direction. The first resistance line includes a first resistance segment and a second resistance segment that are connected to each other, an end of the first resistance segment away from a connection point is coupled to the first coupling portion, and an end of the second resistance segment away from the connection point is coupled to the first electrode of the first light-emitting device, the connection point is a position where the first resistance segment is connected to the second resistance segment. The second resistance line includes the first resistance segment and a third resistance segment connected to the connection point, and an end of the third resistance segment away from the connection point is coupled to the first electrode of the second light-emitting device.

In some embodiments, an orthographic projection of the first resistance segment on the substrate and an orthographic projection of the first power supply line on the substrate have an overlapped region therebetween.

In some embodiments, the first electrode of the first light-emitting device and the first electrode of the second light-emitting device are arranged side by side, and the first electrode of the second light-emitting device is adjacent to the first resistance segment. The second resistance segment extends in the first direction and is located on a side of the first electrode of the first light-emitting device away from the first electrode of the second light-emitting device, and the third resistance segment extends in the second direction and is located between the first resistance segment and the first electrode of the first light-emitting device.

In some embodiments, an end of the second resistance segment coupled to the first electrode of the first light-emitting device extends to an edge of the first electrode of the first light-emitting device proximate to the second power supply line; and an end of the third resistance segment coupled to the first electrode of the second light-emitting device extends to an edge of the first electrode of the second light-emitting device proximate to the first power supply line.

In some embodiments, a dimension of the first electrode of the second light-emitting device in the first direction is greater than a dimension of the first electrode of the first light-emitting device in the first direction.

In some embodiments, the light-emitting substrate further includes a pixel defining layer. The pixel defining layer defines a plurality of openings, the plurality of openings include a first opening and a second opening, the first light-emitting device is disposed in the first opening, and the second light-emitting device is disposed in the second opening. A dimension of the second opening in the first direction is greater than a dimension of the first opening in the first direction.

In some embodiments, the plurality of light-emitting devices further include a third light-emitting device and a fourth light-emitting device. The plurality of resistance lines further include a third resistance line and a fourth resistance line. An end of the third resistance line is coupled to the first coupling portion, and another end of the third resistance line is coupled to a first electrode of the third light-emitting device. An end of the fourth resistance line is coupled to the first coupling portion, and another end of the fourth resistance line is coupled to a first electrode of the fourth light-emitting device. About a first straight line, passing through the first coupling portion and perpendicular to the first power supply line, on a plane where the substrate is located, a structure of the first resistance line, the second resistance line, the third resistance line and the fourth resistance line is axisymmetric, and/or, a structure of the first light-emitting device, the second light-emitting device, the third light-emitting device and the fourth light-emitting device is axisymmetric.

In some embodiments, the second power supply line includes a second coupling portion. The plurality of light-emitting devices further include a fifth light-emitting device and a sixth light-emitting device. The plurality of resistance lines further include a fifth resistance line and a sixth resistance line. An end of the fifth resistance line is coupled to the second coupling portion, and another end of the fifth resistance line is coupled to a first electrode of the fifth light-emitting device. An end of the sixth resistance line is coupled to the second coupling portion, and another end of the sixth resistance line is coupled to a first electrode of the sixth light-emitting device. About a second straight line, parallel to both the first power supply line and the second power supply line and located between the first light-emitting device and the second light-emitting device, on a plane where the substrate is located, a structure of the first resistance line, the second resistance line, the fifth resistance line and the sixth resistance line is axisymmetric, and/or, a structure of the first light-emitting device, the second light-emitting device, the fifth light-emitting device and the sixth light-emitting device is axisymmetric.

In some embodiments, the plurality of light-emitting devices further include a seventh light-emitting device and an eighth light-emitting device. The plurality of resistance lines further include a seventh resistance line and an eighth resistance line. An end of the seventh resistance line is coupled to the second coupling portion, and another end of the seventh resistance line is coupled to a first electrode of the seventh light-emitting device. An end of the eighth resistance line is coupled to the second coupling portion, and another end of the eighth resistance line is coupled to a first electrode of the eighth light-emitting device. About a third straight line, passing through the second coupling portion and perpendicular to the second power supply line, on the plane where the substrate is located, a structure of the fifth resistance line, the sixth resistance line, the seventh resistance line and the eighth resistance line is axisymmetric, and/or, a structure of the fifth light-emitting device, the sixth light-emitting device, the seventh light-emitting device and the eighth light-emitting device is axisymmetric.

In some embodiments, the plurality of power supply lines further include a third power supply line. The third power supply line is parallel to the first power supply line, and the third power supply line is located on a side of the second power supply line away from the first power supply line and is adjacent to the second power supply line. About a fourth straight line, passing through the second coupling portion and parallel to the first power supply line, on the plane where the substrate is located, a structure of all resistance lines coupled to the second power supply line is axisymmetric, and/or, a structure of all light-emitting device coupled to the second power supply line is axisymmetric.

In some embodiments, the plurality of power supply lines and the plurality of resistance lines are provided with an insulating layer therebetween, and the insulating layer is provided with a plurality of via holes therein. The plurality of via holes include a first via hole corresponding to a position of the first coupling portion and a second via hole corresponding to a position of the second coupling portion, and a size of the second via hole is substantially equal to a size of the first via hole.

In some embodiments, each resistance line has substantially a same resistance value.

In another aspect, a light-emitting apparatus is provided. The light-emitting apparatus includes the light-emitting substrate as described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
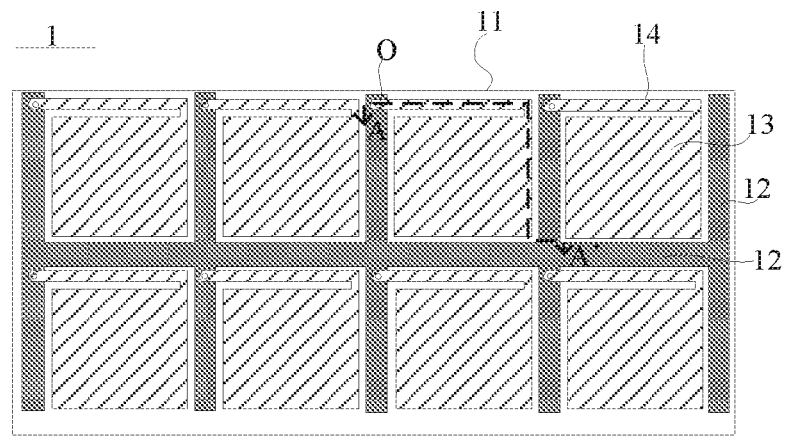
FIG. 1 is a top view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, these specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "a plurality of" or "the plurality of" means two or more.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein means an open and inclusive expression, which does not exclude devices that are applicable to or configured to perform additional tasks or steps.

In addition, the phrase "based on" as used herein is meant to be open and inclusive, since a process, step, calculation or other action that is "based on" one or more of the stated conditions or values may, in practice, be based on additional conditions or values exceeding those stated.

The term "about" or "approximately" as used herein includes a stated value and an average value within an acceptable range of deviation of a particular value. The acceptable range of deviation is determined by a person of ordinary skill in the art in view of the measurement in question and errors associated with the measurement of a particular quantity (i.e. limitations of the measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate, and may of course include other components, such as a circuit for providing electrical signals for the light-emitting substrate to drive the light-emitting substrate to emit light. The circuit may be referred to as a control circuit, which may include a circuit board electrically connected to the light-emitting substrate and/or an integrated circuit (IC) electrically connected to the light-emitting substrate.

The light-emitting apparatus may be a lighting apparatus. For example, the light-emitting apparatus may be a backlight module of a liquid crystal display apparatus, a lamp for internal or external lighting (e.g., a car lamp), a kind of signal lamps, or the like.

In some embodiments, the light-emitting substrate may be any one of self-luminous light-emitting substrates such as an organic light-emitting diode (OLED) light-emitting substrate or a quantum dot light-emitting diode (QLED) light-emitting substrate.

A significant advantage of the self-luminous light-emitting substrates is that a large-sized surface light source with any shape may be achieved. However, the self-luminous light-emitting device (e.g., an OLED light-emitting device) is a laminated thin film device, and a distance between an anode and a cathode thereof is relatively small. In particular, dust particles will inevitably be introduced in a process of manufacturing the light-emitting device, and the introduction of the dust particles and defects such as pinholes, cracks, step differences and coating roughness in the light-emitting device may cause direct contact between the anode and the cathode, thereby forming defect points (also known as short-circuit points) which affect the production yield of self-luminous light-emitting substrates.

The light-emitting substrate may include one or more light-emitting devices. In a case where one light-emitting substrate is adopted, a size of the light-emitting device is relatively large, and there is a large probability that the anode is in direct contact with the cathode, which is not conducive to improving the production yield of the light-emitting substrate. In a case where a plurality of light-emitting devices are adopted, although the probability that the anode is in direct contact with the cathode may be effectively reduced, it is still difficult to avoid the above short-circuit defects.

In the related art, the distance between the anode and the cathode may be increased by means of adding a conductive functional layer in light-emitting device, so as to reduce the probability that the anode is in direct contact with the cathode, thus avoid the occurrence of short-circuit defects. However, an increase in thickness of the light-emitting device will inevitably lead to an increase in a turn-on voltage of the light-emitting device and a decrease in the efficiency of the light-emitting device, thereby resulting in a decrease in the overall performance of the light-emitting device.

Figure 2:
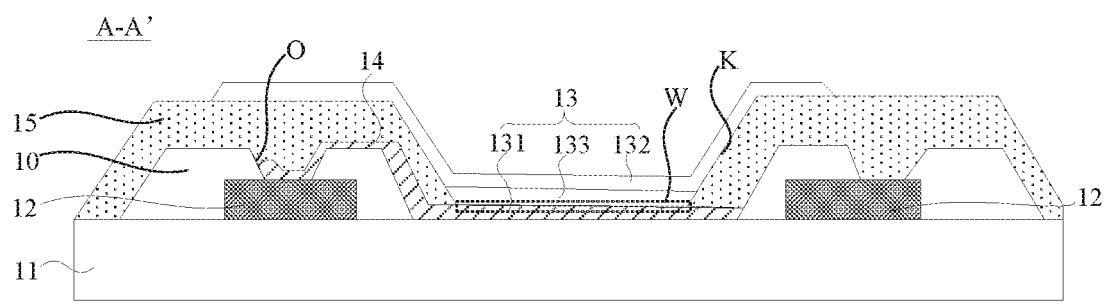
FIG. 2 is a sectional view taken along the A-A' direction in FIG. 1.

Some embodiments of the present disclosure provide a light-emitting substrate. Referring to FIGS. 1 and 2, the light-emitting substrate 1 includes a substrate 11, a plurality of power supply lines 12 disposed on the substrate 11, and a plurality of light-emitting devices 13 disposed on the substrate 11. Each light-emitting device 13 includes, in a direction perpendicular to the substrate 11, a first electrode 131 and a second electrode 132 that are arranged sequentially, and a light-emitting functional layer 133 disposed between the first electrode 131 and the second electrode 132. The first electrode 131 is closer to the substrate 11 than the second electrode 132. Each light-emitting device 13 may be coupled to a power supply line 12 through a respective first electrode 131 thereof.

As shown in FIG. 1, the plurality of power supply lines 12 may be in a shape of a grid. In this case, the plurality of power supply lines 12 may be connected to the control circuit through some or all of the plurality of power supply lines 12, so as to drive each light-emitting device 13 to emit light according to the electrical signals provided by the control circuit.

The light-emitting device 13 may be an OLED light-emitting device, and in this case, the light-emitting functional layer 133 may include an organic light-emitting layer. In some other embodiments, the light-emitting device 13 may be a QLED light-emitting device, and in this case, the light-emitting functional layer 133 may include a quantum dot light-emitting layer. In the following, the embodiments of the present disclosure will be described by considering an example in which the light-emitting device 13 is the OLED light-emitting device.

In some embodiments, as shown in FIG. 2, the first electrode 131 may be the anode, and in this case, the second electrode 132 is the cathode. In some other embodiments, the first electrode 131 may be the cathode, and in this case, the second electrode 132 is the anode.

In some embodiments, a material of the anode may be selected from materials with high work functions that may be, for example, transparent conductive materials such as indium tin oxide (ITO), indium zinc oxide (IZO), tin dioxide ($SnO_2$) and zinc oxide (ZnO), or metal materials such as silver (Ag) and silver alloys, and aluminum (Al) and aluminum alloys, or composite materials of the above materials that are stacked (e.g., Ag/ITO, Al/ITO, Ag/IZO and Al/IZO, where "Ag/ITO" is referred to as a stacked structure of a metallic silver electrode and an ITO electrode). A material of the cathode may be selected from materials with low work functions, such as lithium fluoride (LiF/Al), a metal Al, Ag or magnesium (Mg), or an alloy material with a low work function (e.g., a magnesium-aluminum alloy or a magnesium-silver alloy).

In some embodiments, as shown in FIG. 1, the light-emitting substrate 1 further includes a plurality of resistance lines 14. An end of each resistance line 14 is coupled to a power supply line 12, and the other end of each resistance line 14 is coupled to a first electrode 131 of a light-emitting device 13. Each resistance line 14 and the first electrode 131 coupled thereto are disposed in a same layer.

Figure 3:
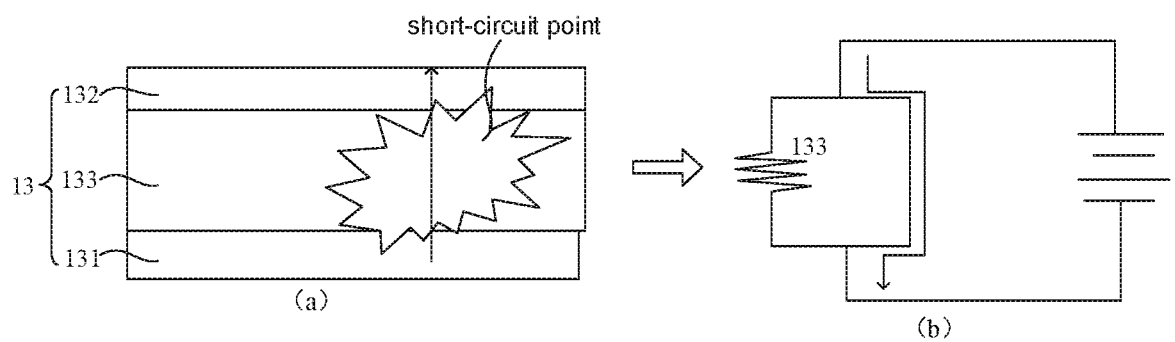
FIG. 3 is a diagram showing a structure and an equivalent circuit of an anode and a cathode being short-circuited, in a case where a plurality of resistance lines are not provided in the related art.

The part (a) in FIG. 3 is a diagram showing a structure of the anode and the cathode of the light-emitting device 13 being short-circuited in a case where the plurality of resistance lines 14 are not provided; and the part (b) in FIG. 3 is a diagram showing an equivalent circuit of the anode and the cathode of the light-emitting device 13 being short-circuited in the case where the plurality of resistance lines 14 are not provided. The part (a) in FIG. 4 is a diagram showing a structure of the anode and the cathode of the light-emitting device 13 being short-circuited in a case where the plurality of resistance lines 14 are provided; and the part (b) in FIG. 4 is a diagram showing an equivalent circuit of the anode and the cathode of the light-emitting device 13 being short-circuited in the case where the plurality of resistance lines 14 are provided.

Figure 4:
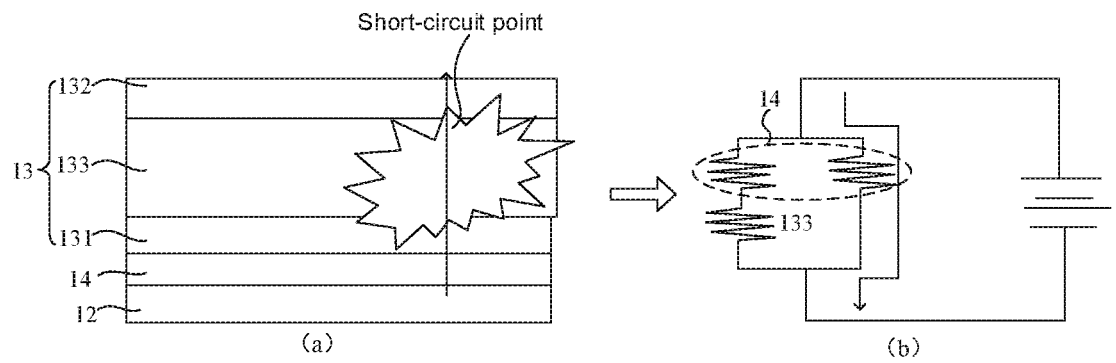
FIG. 4 is a diagram showing a structure and an equivalent circuit of an anode and a cathode being short-circuited, in a case where a plurality of resistance lines are provided, in accordance with some embodiments.

It can be seen from FIGS. 3 and 4 that, in the case where the plurality of resistance lines 14 are not provided, the current tends to flow through the short-circuit point(s) when the light-emitting device 13 works, so that the current hardly flows through other positions of the light-emitting device 13, and thus light exiting from the light-emitting device 13 is reduced or even eliminated. In the case where the plurality of resistance lines 14 are provided, due to the existence of each resistance line 14, it may be possible to prevent the current from tending to flow through the short-circuit point(s), so as to prevent the short circuits. Compared with the related art in which the conductive functional layer is added to the light-emitting device 13 to increase the distance between the anode and the cathode but increase the overall thickness of the light-emitting device 13, the plurality of resistance lines 14 will not affect the thickness of the light-emitting device 13. In addition, compared with the related art in which the light-emitting substrate 1 includes only one light-emitting device 13, the plurality of light-emitting devices 13 are arranged to pixelate the light-emitting substrate 1, so that the probability that the anode is in direct contact with the cathode may be reduced. In addition, by providing the resistance line 14 between the first electrode 131 of each light-emitting device 13 and a power supply line 12 coupled thereto, light-emission of other light-emitting devices 13 may not be affected in a case where any light-emitting device 13 is short-circuited, thereby improving the yield of the entire light-emitting substrate 1.

In addition, each resistance line 14 and the first electrode 131 coupled thereto are arranged in the same layer, so that it may be possible to reduce the manufacturing processes and the manufacturing difficulty.

Figure 5:
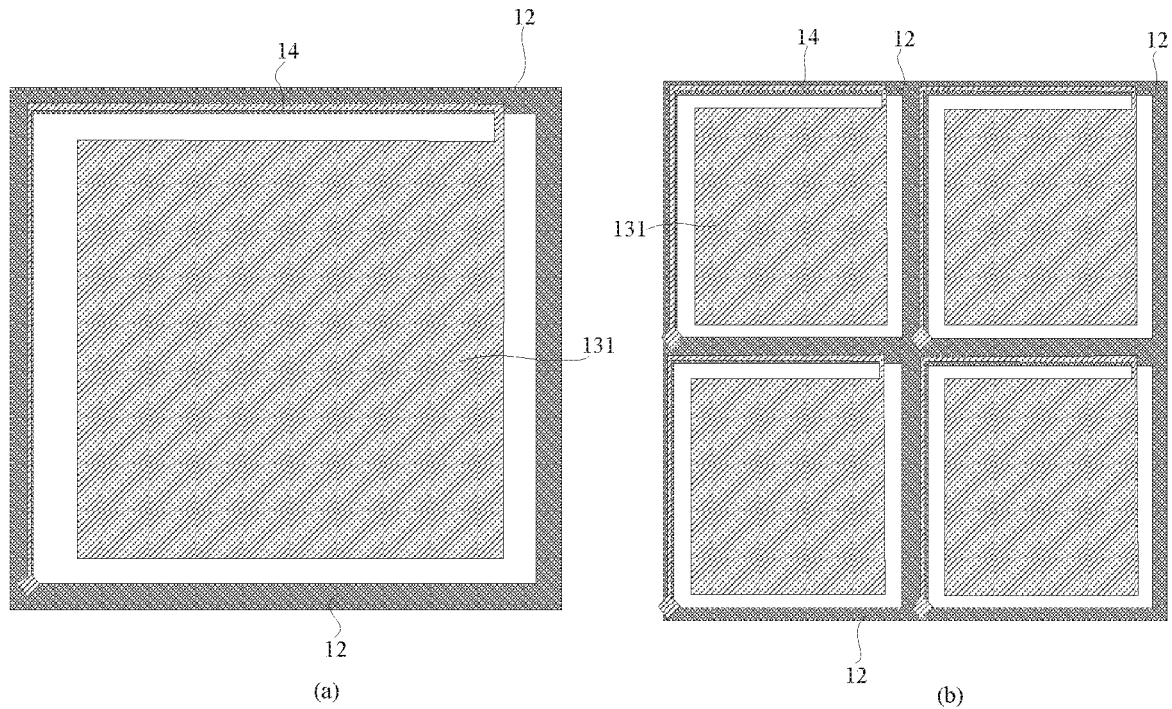
FIG. 5 is a comparison diagram of an aperture ratio of a light-emitting device having a first electrode with a dimension of 100 μm and an aperture ratio of a light-emitting device having a first electrode with a dimension of 50 µm, in accordance with some embodiments.

It will be noted that, although it may be possible to reduce the probability that the anode is in direct contact with the cathode and improve the yield by pixelating the light-emitting substrate 1, it does not mean that the smaller the size of the light-emitting device 13, the better the light-emitting device 13. For example, FIG. 5 is a comparison diagram of an aperture ratio of a light-emitting device 13 having a first electrode 131 with a dimension of 100 μm and an aperture ratio of a light-emitting device 13 having a first electrode 131 with a dimension of 50 μm. The part (a) in FIG. 5 is a diagram showing a structure of the light-emitting device 13 having the first electrode 131 with the dimension of 100 μm; and the part (b) in FIG. 5 is a diagram showing a structure of the light-emitting device 13 having the first electrode 131 with the dimension of 50 μm. As can be seen from FIG. 5, in a case where the dimension of the first electrode 131 of the light-emitting device 13 is switched from 100 μm to 50 μm, the aperture ratio of the light-emitting device 13 is reduced greatly. Moreover, it is found through calculation that, in the case where the dimension of the first electrode 131 of the light-emitting device 13 is 100 μm, the aperture ratio may be greater than 80%. However, in the case where the dimension of the first electrode 131 of the light-emitting device 13 is 50 μm, the aperture ratio may be less than 50%, which may affect the luminance of the light-emitting device 13 significantly, and thus further affect the service life of the light-emitting device 13. In particular, the service life of the car lamp is generally required to be greater than 15 years, thus a relatively large aperture ratio is particularly important.

Figure 6:
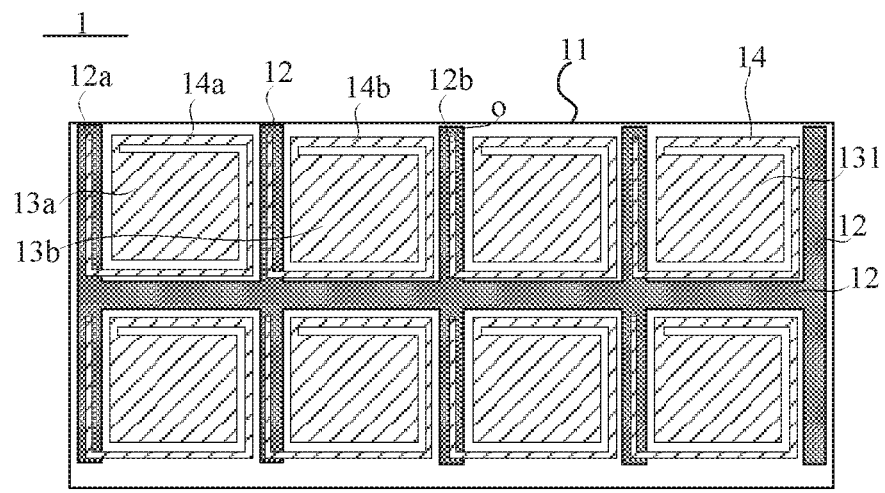
FIG. 6 is a top view of another light-emitting substrate, in accordance with some embodiments.

It can be seen according to that each resistance line 14 and the first electrode 131 coupled thereto are disposed in the same layer that, in order to ensure a sufficient length of each resistance line 14 to ensure a sufficient resistance value of each resistance line 14 for preventing short circuit, each resistance line 14 may be disposed at a periphery of multiple first electrodes 13, and there is a gap between each resistance line 14 and each first electrode 131. FIG. 6 shows an example in which each resistance line 14 is disposed around a single first electrode 131. In this way, for a bottom-emission light-emitting device, the dimension of each first electrode 131 is not only related to an area occupied by the plurality of supply power lines 12, but also related to an area occupied by the plurality of resistance lines 14.

In some embodiments, an orthographic projection of each power supply line 12 on the substrate 11 is located outside an orthographic projection of a portion of the light-emitting functional layer 133 of each light-emitting device 13 in contact with the first electrode 131 of the light-emitting device 13 on the substrate 11.

The description that the orthographic projection of each power supply line 12 on the substrate 11 is located outside the orthographic projection of the portion of the light-emitting functional layer 133 of each light-emitting device 13 in contact with the first electrode 131 of the light-emitting device 13 on the substrate 11 means that, the orthographic projection of each power supply line 12 on the substrate 11 does not overlap with the orthographic projection of the portion of the light-emitting functional layer 133 of each light-emitting device 13 in contact with the first electrode 131 of the light-emitting device 13 on the substrate 11. That is, in a case where the light emitted by each light-emitting device 13 exits from the substrate 11, each power supply line 12 will not affect the exit light. In this case, the light-emitting substrate 1 may be a bottom-emission light-emitting substrate, and the first electrode 131 may be a transparent anode.

In some embodiments, as shown in FIG. 2, the light-emitting substrate 1 may further include a pixel defining layer 15 disposed on the substrate 11. The pixel defining layer 15 defines a plurality of openings K, and each light-emitting device 13 may be disposed in an opening K.

In this case, as shown in FIG. 2, the first electrode 131 of the light-emitting device 13 may be disposed on a side of the pixel defining layer 15 proximate to the substrate 11, and the portion of the light-emitting functional layer 133 in contact with the first electrode 131 is represented by the dotted box W in FIG. 2. In the case where the light-emitting substrate 1 is the bottom-emission light-emitting substrate, the orthographic projection of each power supply line 12 on the substrate 11 is located outside the region represented by the dotted box W. FIG. 6 shows an example in which the orthographic projection of each power supply line 12 on the substrate 11 is located outside the orthographic projection of the portion of the light-emitting functional layer 133 of each light-emitting device 13 in contact with the first electrode 131 of each light-emitting device 13 on the substrate 11. In this example, the plurality of power supply lines 12 are in the shape of the grid, and each resistance line 14 is disposed around a first electrode 131 of a single light-emitting device 13. When the power is supplied, the current flows through the resistance line 14, the first electrode 131, the light-emitting functional layer 133 and the second electrode 132 in sequence after flowing through the power supply line 12. According to the path that the current flows through, a material, a length and a width of the resistance line 14 may be selected to reasonably set the resistance of the resistance line 14 in practical applications, so as to prevent short circuit.

In some embodiments, as shown in FIG. 6, each resistance line 14 has substantially the same resistance value. It can be seen from the voltage being equal to the current multiplied by the resistance that, in a case where a voltage applied to an end of the resistance line 14 coupled to the power supply line 12 and a voltage applied to the second electrode 132 are substantially the same, since each resistance line 14 has substantially the same resistance value, it may ensure that a divided voltage between the first electrode 131 and the second electrode 132 of each light-emitting device 13 is substantially the same, thereby ensuring luminance uniformity of the plurality of light-emitting devices 13 to the greatest extent.

In some embodiments, it can be seen according to that each resistance line 14 and the first electrode 131 coupled thereto are disposed in the same layer that, as shown in FIG. 2, an insulating layer 10 may be provided between each resistance line 14 and the plurality of power supply lines 12. The insulating layer 10 is provided with a plurality of via holes O therein, and each resistance line 14 may be coupled to a power supply line 12 through a via hole O in the insulating layer 10.

In some embodiments, as shown in FIGS. 7, 8, 9 and 10, the plurality of light-emitting devices 13 form a plurality of lines of light-emitting devices 13 arranged in a first direction (as shown by the arrow a in FIGS. 7, 8, 9 and 10), light-emitting devices 13 in each line of light-emitting devices 13 are arranged in a second direction (as shown by the arrow b in FIGS. 7, 8, 9 and 10), and the first direction intersects the second direction. The plurality of power supply lines 12 include a first power supply line 12a and a second power supply line 12b that extend in the second direction and are arranged adjacent to each other in the first direction. the first power supply line 12a and the second power supply line 12b are provided with at least one line of light-emitting devices 12 therebetween, and a first electrode 131 of each light-emitting device 13 in the at least one line of light-emitting devices 13 is coupled to the first power supply line 12a or the second power supply line 12b.

Figure 7:
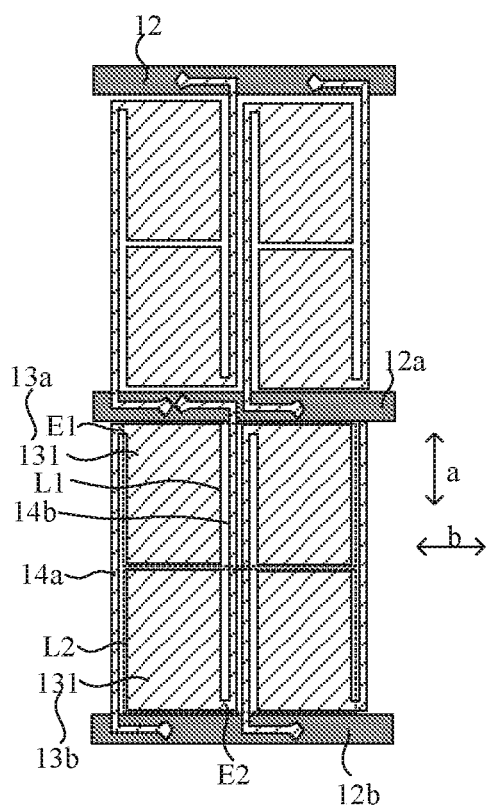
FIG. 7 is a top view of yet another light-emitting substrate, in accordance with some embodiments.
Figure 8:
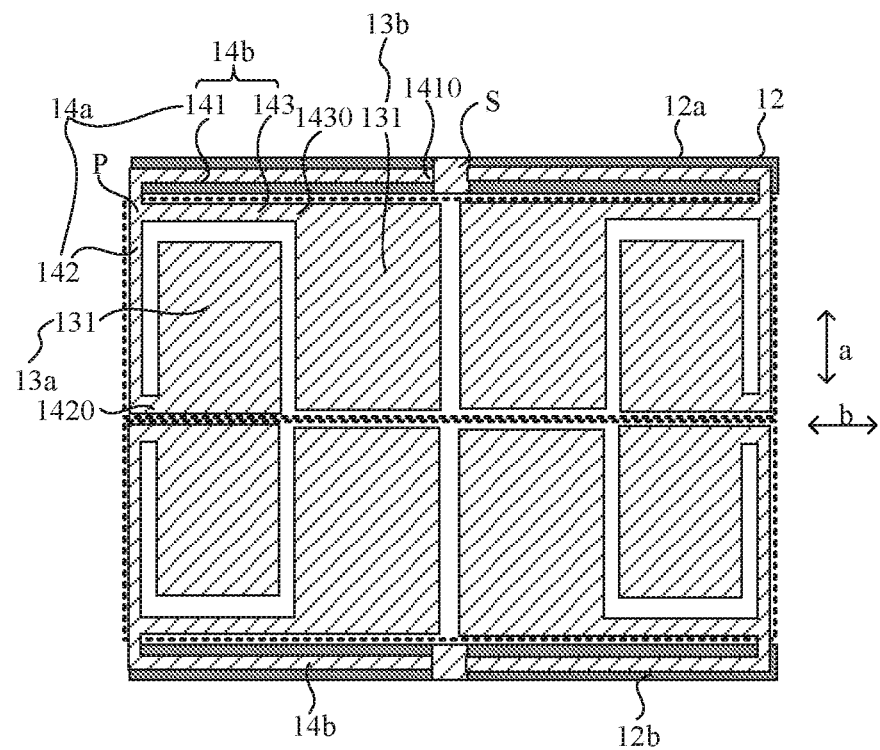
FIG. 8 is a top view of yet another light-emitting substrate, in accordance with some embodiments.
Figure 9:
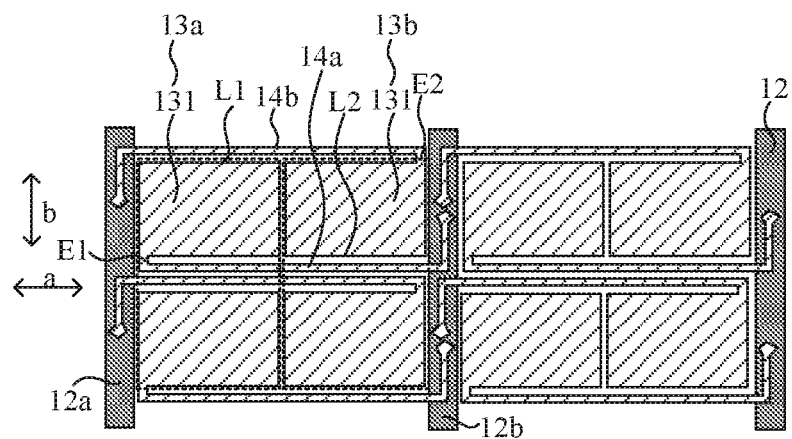
FIG. 9 is a top view of yet another light-emitting substrate, in accordance with some embodiments.
Figure 10:
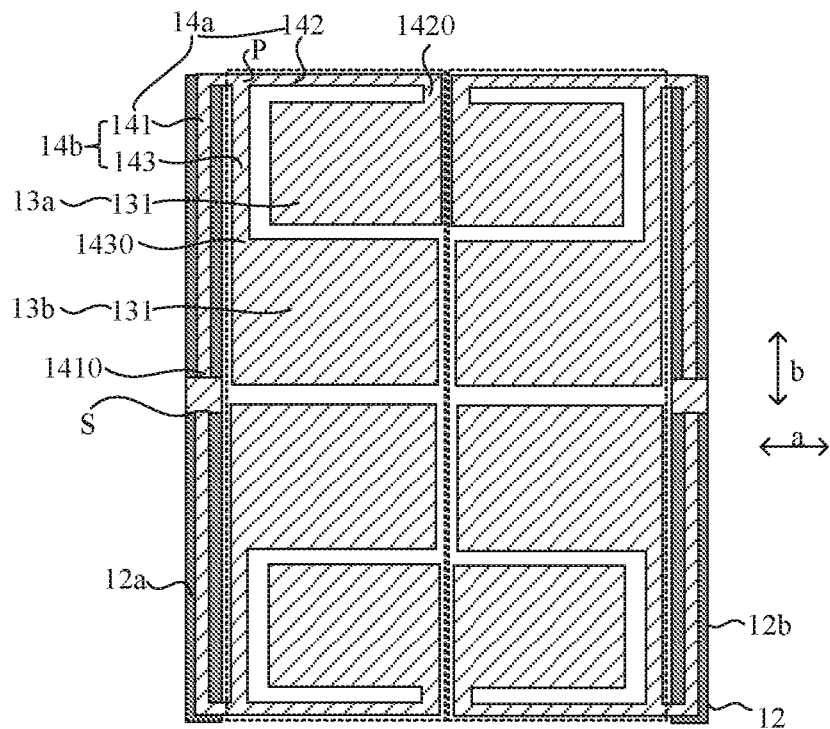
FIG. 10 is a top view of yet another light-emitting substrate, in accordance with some embodiments.

The plurality of light-emitting devices 12 may be arranged in a form of rows and columns. For example, as shown in FIGS. 7, 8, 9 and 10, the first direction is perpendicular to the second direction. In this case, as shown in FIGS. 7 and 8, the first direction may be a column direction of the plurality of light-emitting devices 13, and the second direction is a row direction of the plurality of light-emitting devices 13. Alternately, as shown in FIGS. 9 and 10, the first direction may be the row direction of the plurality of light-emitting devices 13, and the second direction is the column direction of the plurality of light-emitting devices 13.

In a case where the first direction is the column direction of the plurality of light-emitting devices 13 and the second direction is the row direction of the plurality of light-emitting devices 13, as shown in FIGS. 7 and 8, the first power supply line 12a and the second power supply line 12b extend in the row direction of the plurality of light-emitting devices 13 and are arranged in the column direction of the plurality of light-emitting devices 13. In a case where the first direction is the row direction of the plurality of light-emitting devices 13 and the second direction is the column direction of the plurality of light-emitting devices, as shown in FIGS. 9 and 10, the first power supply line 12a and the second power supply line 12b extend in the column direction of the plurality of light-emitting devices 13 and are arranged in the row direction of the plurality of light-emitting devices 13.

In either case, the description that the at least one line of light-emitting devices 13 are provided between the first power supply line 12a and the second power supply line 12b means that, one line of light-emitting devices 13 or more than two lines of light-emitting devices 13 are provided between the first power supply line 12a and the second power supply line 12b. For example, as shown in FIGS. 7 and 8, the first power supply line 12a and the second power supply line 12b extend in the row direction of the plurality of light-emitting devices 13 and are arranged in the column direction of the plurality of light-emitting devices 13, the description that the at least one line of light-emitting devices 13 are provided between the first power supply line 12a and the second power supply line 12b means that, one row of light-emitting devices 13 or more than two rows of light-emitting devices 13 are provided between the first power supply line 12a and the second power supply line 12b. For another example, as shown in FIGS. 9 and 10, the first power supply line 12a and the second power supply line 12b extend in the column direction of the plurality of light-emitting devices 13 and are arranged in the row direction of the plurality of light-emitting devices 13, the description that the at least one line of light-emitting devices 13 are provided between the first power supply line 12a and the second power supply line 12b means that, one column of light-emitting devices 13 or more than two columns of light-emitting devices 13 are provided between the first power supply line 12a and the second power supply line 12b.

In these embodiments, more than two lines of light-emitting devices 13 are provided between the first power supply line 12a and the second power supply line 12b, so that it may be possible to reduce the area occupied by the power supply lines 12 and increase an area of the first electrode 131 of each light-emitting device 13 located between the first power supply line 12a and the second power supply line 12b while ensuring the power supply to each light-emitting device 13 is ensured, thereby increasing the aperture ratio.

In conjunction with FIGS. 6, 2 and 8, in term of the design limit, t is assumed that the dimensions occupied by the power supply line 12, the insulating layer 10, the pixel defining layer 15 and the first electrode 131 between two adjacent light-emitting devices 13 are each 2 μm. In this case, minimum dimensions on two sides of a light-emitting device 13 (the minimum dimensions occupied by the power supply line 12, the insulating layer 10, the pixel defining layer 15 and the first electrode 131 are each 2 μm, a minimum dimension occupied by all of the power supply line 12, the insulating layer 10, the pixel defining layer 15 and the first electrode 131 is 8 μm that is equal to 2 μm by 4, and the minimum dimensions on the two sides of the light-emitting device 13 are both 16 μm that is equal to 8 μm by 2) are subtracted from an original dimension of 50 μm in a region, so that a maximum dimension, for emitting light in effect, of the first electrode 131 in the light-emitting device 13 is 34 μm. Therefore, the aperture ratio is equal to (34×34)/(50×50)×100%, which is approximately equal to 46%.

In conjunction with FIGS. 6, 8 and 9, after removing the power supply line 12 between the first power supply line 12a and the second power supply line 12b, since there is no power supply line 12 between two adjacent light-emitting devices 13, the dimension of the first electrode 131 of each light-emitting device 13 may increase by 2 μm to 4 μm on a basis of the original dimension. In this case, the aperture ratio may approximately be 52% (which is equal to (36×36)/(50×50)×100%) to 57% (which is equal to (38×38)/(50×50)×100%). As a result, the aperture ratio may be greatly improved, which is beneficial to improve the service life of the light-emitting device 13.

In some embodiments, as shown in FIGS. 7, 8, 9 and 10, the plurality of light-emitting devices 13 include a first light-emitting device 13a and a second light-emitting device 13b that are adjacent in the first direction or in the second direction. The plurality of resistance lines 14 include a first resistance line 14a and a second resistance line 14b. The first resistance line 14a is coupled to a first electrode 131 of the first light-emitting device 13a, and the second resistance line 14b bypasses at least one edge L1 of the first electrode 131 of the first light-emitting device 13a and is coupled to a first electrode 131 of the second light-emitting device 13b.

The description that the second resistance line 14b bypasses the at least one edge of the first electrode 131 of the first light-emitting device 13a and is coupled to the first electrode 131 of the second light-emitting device 13b means that, the second resistance line 14b is disposed at a periphery of the at least one edge of the first electrode 131 of the first light-emitting device 13a and is coupled to the first electrode 131 of the second light-emitting device 13b.

As shown in FIG. 6, the second resistance line 14b surrounds the first electrode 131 of the second light-emitting device 13b, an area occupied by the second resistance line 14b and a gap between the second resistance line 14b and the first electrode 131 of the second light-emitting device 13b both determine that the dimension of the first electrode 131 of the second light-emitting device 13b is relatively small. In these embodiments, the second resistance line 14b bypasses the at least one edge of the first electrode 131 of the first light-emitting device 13a and is coupled to the first electrode of the second light-emitting device 13b, so that it may be possible to shorten the portion of the second resistance line 14b at the periphery of the first electrode 131 of the second light-emitting device 13b and reduce the gap between the second resistance line 14b and the first electrode 131 of the second light-emitting device 13b on a premise of ensuring the length of the second resistance line 14b. Therefore, the area of the first electrode 131 of the second light-emitting device 13b may increase to the greatest extent, and thus the aperture ratio of the second light-emitting device 13b may increase.

In some embodiments, the second resistance line 14b is adjacent to the first electrode 131 of the first light-emitting device 13a.

The description that the second resistance line 14b is adjacent to the first electrode 131 of the first light-emitting device 13a means that, there are no other resistance lines 14 and no other first electrodes 131 between the second resistance line 14b and the first light-emitting device 13a. It may be possible to reduce the gap between the second resistance line 14b and the first electrode 131 of the first light-emitting device 13a on a premise of ensuring the sufficient length of the second resistance line 14. In addition, depending on the above, the first resistance line 14a may also be coupled to the second power supply line 12b. In this case, the first resistance line 14a may bypass the first electrode 131 of the second light-emitting device 13b and is coupled to the first electrode 131 of the first light-emitting device 13a, so that the first resistance line 14a may not surround the first electrode 131 of the first light-emitting device 13a on a premise of ensuring the length of the first resistance line 14a. Therefore, the area occupied by the first electrode 131 of the first light-emitting device 13a may increase, and thus the aperture ratio of the first light-emitting device 13a may increase.

In some embodiments, as shown in FIGS. 7 and 9, the first light-emitting device 13a and the second light-emitting device 13b are located between the first power supply line 12a and the second power supply line 12b. The first power supply line 12a, the first light-emitting device 13a, the second light-emitting device 13b and the second power supply line 12b are sequentially arranged in the first direction. The first electrode 131 of the first light-emitting device 13a is coupled to the second power supply line 12b through the first resistance line 14a, the first electrode 131 of the second light-emitting device 13b is coupled to the first power supply line 12a through the second resistance line 14b, and the first resistance line 14a bypasses at least one edge L2 of the first electrode 131 of the second light-emitting device 13b and is coupled to the first electrode 131 of the first light-emitting device 13a.

In these embodiments, while the lengths of the first resistance line 14a and the second resistance line 14b are ensured, it may be possible to shorten the portion of the first resistance line 14a at the periphery of the first electrode 131 of the first light-emitting device 13a and the portion of the second resistance line 14b at the periphery of the first electrode 131 of the second light-emitting device 13b. It may be possible to increase areas of the first electrode 131 of the first light-emitting device 13a and the first electrode 131 of the second light-emitting device 13b, and thus increase the aperture ratios of the first light-emitting device 13a and the second light-emitting device 13b together.

In some embodiments, as shown in FIGS. 7 and 9, at least a part of the first resistance line 14a and at least a part of the second resistance line 14b are distributed on two opposite sides, arranged in the second direction, of a group of the first electrode of the first light-emitting device 13a and the first electrode of the second light-emitting device 13b.

In these embodiments, while the lengths of the first resistance line 14a and the second resistance line 14b are ensured, the first resistance line 14a and the second resistance line 14b may be evenly distributed on the two opposite sides, arranged in the second direction, of the group of the first electrode of the first light-emitting device 13a and the first electrode of the second light-emitting device 13b, thereby improving the distribution uniformity of the first light-emitting device 13a and the second light-emitting device 13b.

In some embodiments, as shown in FIGS. 7 and 9, an end E1 of the first resistance line 14a coupled to the first electrode 131 of the first light-emitting device 13a extends to an edge of the first electrode 131 of the first light-emitting device 13a proximate to the first power supply line 12a, and/or, an end E2 of the second resistance line 14b coupled to the first electrode 131 of the second light-emitting device 13b extends to an edge of the first electrode 131 of the second light-emitting device 13b proximate to the second power supply line 12b.

In these embodiments, FIGS. 7 and 9 each show a case that the end of the first resistance line 14a coupled to the first electrode 131 of the first light-emitting device 13a extends to a corner position of the edge of the first electrode 131 of the first light-emitting device 13a proximate to the first power supply line 12a, and the end of the second resistance line 14b coupled to the first electrode 131 of the second light-emitting device 13b extends to a corner position of the edge of the first electrode 131 of the second light-emitting device 13b proximate to the second power supply line 12b. It will be understood by those skilled in the art that, the end of the first resistance line 14a coupled to the first electrode 131 of the first light-emitting device 13a may extend to any position of the edge of the first electrode 131 of the first light-emitting device 13a proximate to the first power supply line 12a, and the end of the second resistance line 14b coupled to the first electrode 131 of the second light-emitting device 13b may extend to any position of the edge of the first electrode 131 of the second light-emitting device 13b proximate to the second power supply line 12b. On this basis, an orthographic projection of a portion of the first resistance line 14a extending to the edge of the first electrode 131 of the first light-emitting device 13a proximate to the first power supply line 12a on the substrate 11 may overlap with an orthographic projection of the first power supply line 12a on the substrate 11, and an orthographic projection of a portion of the second resistance line 14b extending to the edge of the first electrode 131 of the second light-emitting device 13b proximate to the second power supply line 12b on the substrate 11 may overlap with an orthographic projection of the second power supply line 12b on the substrate 11. As a result, the aperture ratio may not be affected.

In some other embodiments, as shown in FIGS. 8 and 10, the first power supply line 12a includes a first coupling portion S. The first light-emitting device 13a and the second light-emitting device 13b are arranged in the second direction. The first resistance line 14a includes a first resistance segment 141 and a second resistance segment 142 that are connected to each other. An end 1410 of the first resistance segment 141 away from a connection point P is coupled to the first coupling portion S, an end 1420 of the second resistance segment 142 away from the connection point P is coupled to the first electrode 131 of the first light-emitting device 13a, and the connection point P is a position where the first resistance segment 141 is connected to the second resistance segment 142. The second resistance line 14b includes the first resistance segment 141 and a third resistance segment 143 that is connected to the connection point P, and an end 1430 of the third resistance segment 143 away from the connection point P is coupled to the first electrode 131 of the second light-emitting device 13b.

In these embodiments, the first resistance line 14a and the second resistance line 14b share the first resistance segment 141. It may also be possible to reduce the areas occupied by the first resistance line 14a and the second resistance line 14b on a premise of ensuring the sufficient lengths of the first resistance line 14a and the second resistance line 14b, thereby increasing the aperture ratio.

In some embodiments, as shown in FIGS. 8 and 10, there is an overlapped region between an orthographic projection of the first resistance segment 141 on the substrate 11 and the orthographic projection of the first power supply line 12a on the substrate 11. In this way, the first resistance segment 141 may be partially or entirely located in a region where the first power supply line 12a is located, thereby further reducing the areas occupied by the first resistance line 14a and the second resistance line 14b and increasing the aperture ratio.

In some embodiments, as shown in FIGS. 8 and 10, the first electrode 131 of the first light-emitting device 13a and the first electrode 131 of the second light-emitting device 13b are arranged side by side, and the first electrode 131 of the second light-emitting device 13b is adjacent to the first resistance segment 141. The second resistance segment 142 extends in the first direction (the direction shown by the arrow a in FIG. 10), and the second resistance segment 142 is located on a side of the first light-emitting device 13a away from the second light-emitting device 13b. The third resistance segment 143 extends in the second direction (the direction shown by the arrow b in FIG. 10), and the third resistance segment 143 is located between the first resistance segment 141 and the first light-emitting device 13a.

In these embodiments, since the first resistance line 14a and the second resistance line 14b share the first resistance segment 141, in order to make a resistance value of the first resistance line 14a and a resistance value of the second resistance line 14b substantially the same to ensure the luminance uniformity of the first light-emitting device 13a and the second light-emitting device 13b, materials, lengths and widths of the second resistance segment 142 and the third resistance segment 143 may be reasonably set, so that the resistance value of the second resistance segment 142 and the resistance value of the third resistance segment 143 may be substantially the same.

Here, in term of the design limit, in a case where the material of the first resistance line 14a is the same as the material of the second resistance line 14b, the length and the width of the second resistance segment 142 may be substantially the same as the length and the width of the third resistance segment 143. In this case, if the lengths of two sides of the first light-emitting device 13a extending in the first direction and the second direction are the same, and the length of the third resistance segment 143 and the length of the second resistance segment 142 are both substantially the same as each of the lengths of two sides of the first light-emitting device 13a extending in the first direction and the second direction, the third resistance segment 143 is located between the first light-emitting device 13a and the first resistance segment 141, which may slightly increase the dimension of the first electrode 131 of the second light-emitting device 13b in the first direction. In this way, the dimension of the first electrode 131 of the second light-emitting device 13b in the first direction may be greater than the dimension of the first electrode 131 of the first light-emitting device 13a in the first direction, so as to make full use of space and increase the light-emitting area.

In some embodiments, as shown in FIGS. 8 and 10, an end 1420 of the second resistance segment 142 coupled to the first electrode 131 of the first light-emitting device 13a extends to an edge of the first electrode 131 of the first light-emitting device 13a proximate to the second power supply line 12b, and an end 1430 of the third resistance segment 143 coupled to the first electrode 131 of the second light-emitting device 13b extends to an edge of the first electrode 131 of the second light-emitting device 13b proximate to the first power supply line 12a.

In these embodiments, FIG. 10 shows a case that the end of the second resistance segment 142 coupled to the first electrode 131 of the first light-emitting device 13a extends to a corner position of the edge of the first electrode 131 of the first light-emitting device 13a proximate to the second power supply line 12b, and the end of the third resistance segment 143 coupled to the first electrode 131 of the second light-emitting device 13b extends to a corner position of the edge of the first electrode 131 of the second light-emitting device 13b proximate to the first power supply line 12a. It will be understood by those skilled in the art that, the end of the second resistance segment 142 coupled to the first electrode 131 of the first light-emitting device 13a may extend to any position of the edge of the first electrode 131 of the first light-emitting device 13a proximate to the second power supply line 12b, and the end of the third resistance segment 143 coupled to the first electrode 131 of the second light-emitting device 13b may extend to any position of the edge of the first electrode 131 of the second light-emitting device 13b proximate to the first power supply line 12a. In this case, an orthographic projection of a portion of the second resistance segment 142 extending to the edge of the first electrode 131 of the first light-emitting device 13a proximate to the second power supply line 12b on the substrate 11 may overlap with the orthographic projection of the second power supply line 12b on the substrate 11, and an orthographic projection of a portion of the third resistance segment 143 extending to the edge of the first electrode 131 of the second light-emitting device 13b proximate to the first power supply line 12a on the substrate 11 may overlap with the orthographic projection of the first power supply line 12a on the substrate 11. As a result, the aperture ratio may not be affected.

As shown in FIG. 10, the end of the second resistance segment 142 coupled to the first electrode 131 of the first light-emitting device 13a extends to the corner position of the edge of the first electrode 131 of the first light-emitting device 13a proximate to the second power supply line 12b, and the end of the third resistance segment 143 coupled to the first electrode 131 of the second light-emitting device 13b extends to the corner position of the edge of the first electrode 131 of the second light-emitting device 13b proximate to the first power supply line 12a. In a case where an orthographic projection of the third resistance segment 143 on the substrate 11 is located between the first power supply line 14a and the first electrode 131 of the first light-emitting device 13a, the dimension of the first electrode 131 of the second light-emitting device 13b in the first direction may slightly increase, so that the dimension of the first electrode 131 of the second light-emitting device 13b in the first direction may be greater than the dimension of the first electrode 131 of the first light-emitting device 13a in the first direction, thereby making full use of space and increasing the light-emitting area.

Figure 11:
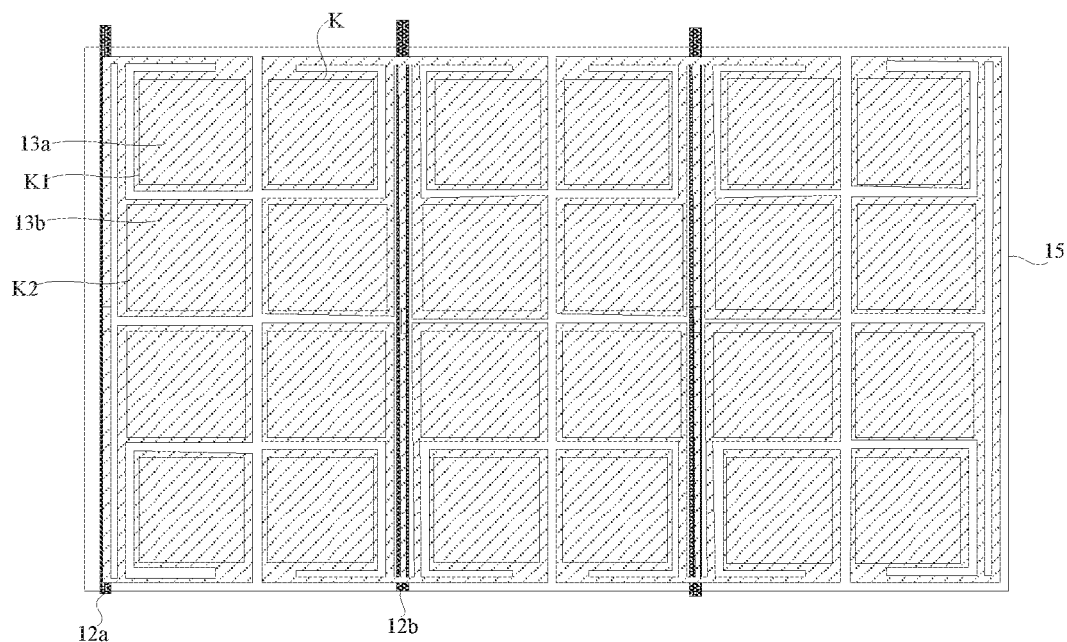
FIG. 11 is a top view of yet another light-emitting substrate, in accordance with some embodiments.

In some embodiments, as shown in FIG. 11, the plurality of openings K defined by the pixel defining layer 15 may include a first opening K1 and a second opening K2. The first light-emitting device 13a is disposed in the first opening K1, the second light-emitting device 13b is disposed in the second opening K2, and a dimension of the second opening K2 in the first direction is greater than a dimension of the first opening K1 in the first direction.

In these embodiments, the pixel defining layer 15 defines the first opening K1 and the second opening K2, so that it may be ensured that, in a case where the dimension of the first electrode 131 of the second light-emitting device 13b in the first direction is greater than the dimension of the first electrode 131 of the first light-emitting device 13a in the first direction, a light-emitting area of the second light-emitting device 13b in the first direction is greater than a light-emitting area of the first light-emitting device 13a in the first direction.

Figure 12:
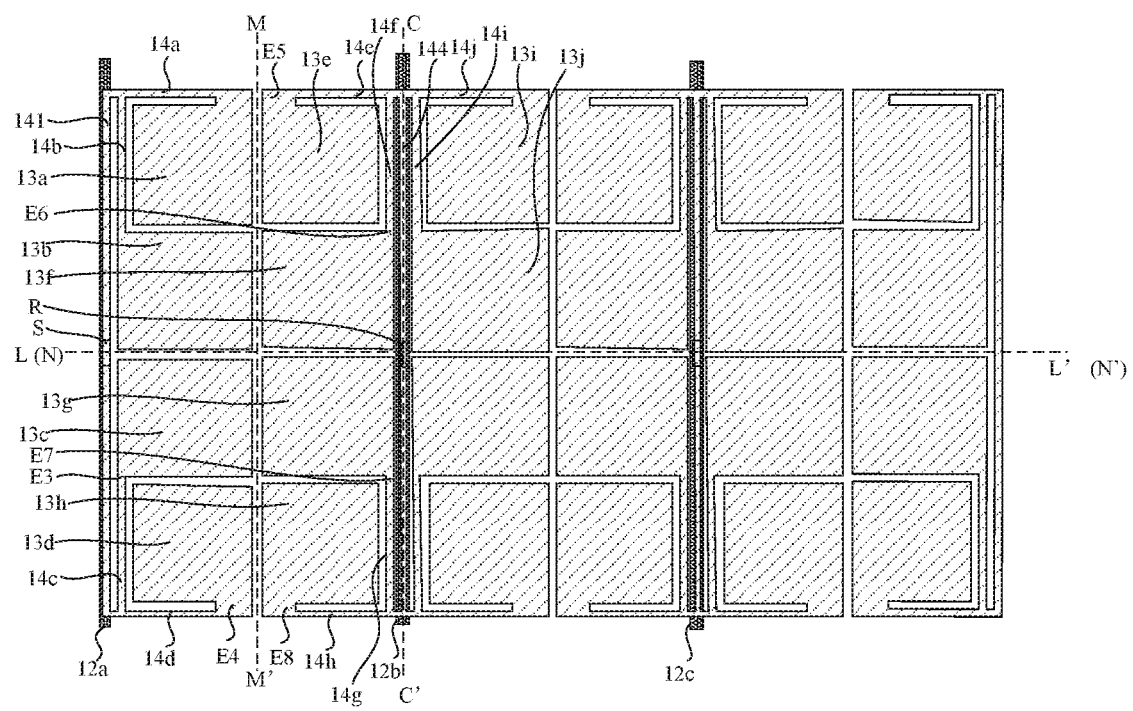
FIG. 12 is a top view of yet another light-emitting substrate, in accordance with some embodiments.

In some embodiments, as shown in FIG. 12, the plurality of light-emitting devices 13 further include a third light-emitting device 13c and a fourth light-emitting device 13d. The plurality of resistance lines 14 further include a third resistance line 14c and a fourth resistance line 14d. An end of the third resistance line 14c is coupled to the first coupling portion S, and another end E3 of the third resistance line 14c is coupled to a first electrode 131 of the third light-emitting device 13c. An end of the fourth resistance line 14d is coupled to the first coupling portion S, and another end E4 of the fourth resistance line 14d is coupled to a first electrode 131 of the fourth light-emitting device 13d. Passing through the first coupling portion S, a first straight line LL' perpendicular to the first power supply line 12a is drawn on a plane where the substrate 11 is located. A structure of the first resistance line 14a, the second resistance line 14b, the third resistance line 14c and the fourth resistance line 14d is axisymmetric about the first straight line LL', and/or, a structure of the first light-emitting device 13a, the second light-emitting device 13b, the third light-emitting device 13c and the fourth light-emitting device 13d is axisymmetric about the first straight line LL'.

In these embodiments, the structure of the first resistance line 14a, the second resistance line 14b, the third resistance line 14c and the fourth resistance line 14d is axisymmetric about the first straight line LL'. In a case where the first resistance line 14a and the second resistance line 14b have substantially the same resistance value, the third resistance line 14c and the fourth resistance line 14d have substantially the same resistance value, and the distribution uniformity of the first resistance line 14a, the second resistance line 14b, the third resistance line 14c and the fourth resistance line 14d may be improved. Moreover, the structure of the first light-emitting device 13a, the second light-emitting device 13b, the third light-emitting device 13c and the fourth light-emitting device 13d is axisymmetric about the first straight line LL', so that in a case where the dimension of the second light-emitting device 13b in the first direction is greater than the dimension of the first light-emitting device 13a in the first direction, the dimension of the third light-emitting device 13c in the first direction is greater than the dimension of the fourth light-emitting device 13d in the first direction. As a result, the light-emitting areas of the light-emitting devices 13 may increase to the greatest extent. In addition, in a case where the orthogonal projection of the portion of the third resistance segment 143 extending to the edge of the first electrode 131 of the second light-emitting device 13b proximate to the first power supply line 12a on the substrate 11 overlaps with the orthogonal projection of the first power supply line 12a on the substrate 11, it may also be possible to ensure the distribution uniformity of the first light-emitting device 13a, the second light-emitting device 13b, the third light-emitting device 13c and the fourth light-emitting device 13d, and improve the luminance uniformity of the light-emitting devices 13.

In some embodiments, as shown in FIG. 12, the second power supply line 12b includes a second coupling portion R. The plurality of light-emitting devices 13 further include a fifth light-emitting device 13e and a sixth light-emitting device 13f, and the plurality of resistance lines 14 further include a fifth resistance line 14e and a sixth resistance line 14f. An end of the fifth resistance line 14e is coupled to the second coupling portion R, and another end E5 of the fifth resistance line 14e is coupled to a first electrode 131 of the fifth light-emitting device 13e. An end of the sixth resistance line 14f coupled to the second coupling portion R, and another end E6 of the sixth resistance line 14f is coupled to a first electrode 131 of the sixth light-emitting device 13f. A second straight line MM' parallel to both the first power supply line 12a and the second power supply line 12b and between the first light-emitting device 13a and the fifth light-emitting device 13e is drawn on the substrate 11, a structure of the first resistance line 14a, the second resistance line 14b, the fifth resistance line 14e and the sixth resistance line 14f is axisymmetric about the second straight line MM', and/or, a structure of the first light-emitting device 13a, the second light-emitting device 13b, the fifth light-emitting device 13e and the sixth light-emitting device 13f is axisymmetric about the second straight line MM'.

In these embodiments, the structure of the first resistance line 14a, the second resistance line 14b, the fifth resistance line 14e, and the sixth resistance line 14f is axisymmetric about the second straight line MM'. In a case where the first resistance line 14a and the second resistance line 14b have substantially the same resistance value, the first resistance line 14a, the second resistance line 14b, the fifth resistance line 14e and the sixth resistance line 14f all have substantially the same resistance value. As a result, the luminance uniformity may be improved, and the distribution uniformity of the first resistance line 14a, the second resistance line 14b, the fifth resistance 14e and the sixth resistance line 14f may also be improved, which facilitates the formation of the patterns. Moreover, the structure of the first light-emitting device 13a, the second light-emitting device 13b, the fifth light-emitting device 13e and the sixth light-emitting device 13f is axisymmetric about the second straight line MM', so that it may also be possible to ensure the distribution uniformity of the first light-emitting device 13a, the second light-emitting device 13b, the fifth light-emitting device 13e and the sixth light-emitting device 13f, and improve the luminance uniformity.

In some embodiments, as shown in FIG. 12, the plurality of light-emitting devices 13 further include a seventh light-emitting device 13g and an eighth light-emitting device 13h. The plurality of resistance lines 14 further include a seventh resistance line 14g and an eighth resistance line 14h. An end of the seventh resistance line 14g is coupled to the second coupling portion R, and another end E7 of the seventh resistance line 14g is coupled to a first electrode 131 of the seventh light-emitting device 13g. An end of the eighth resistance line 14h is coupled to the second coupling portion R, and another end E8 of the eighth resistance line 14h is coupled to a first electrode 131 of the eighth light-emitting device 13h. Passing through the second coupling portion R, a third straight line NN' perpendicular to the second power supply line 12b is drawn on the substrate 11. A structure of the fifth resistance line 14e, the sixth resistance line 14f, the seventh resistance line 14g and the eighth resistance line 14h is axisymmetric about the third straight line NN', and/or, a structure of the fifth light-emitting device 13e, the sixth light-emitting device 13f, the seventh light-emitting device 13g and the eighth light-emitting device 13h is axisymmetric about the third straight line NN'.

In these embodiments, the structure of the fifth resistance line 14e, the sixth resistance line 14f, the seventh resistance line 14g and the eighth resistance line 14h is axisymmetric about the third straight line NN'. In a case where the fifth resistance line 14e, the sixth resistance line 14f, the seventh resistance line 14g and the eighth resistance line 14h have substantially the same resistance value, it may be possible to improve the luminance uniformity of the fifth light-emitting device 13e, the sixth light-emitting device 13f, the seventh light-emitting device 13g and the eighth light-emitting device 13e, and improve the distribution uniformity of the fifth resistance line 14e, the sixth resistance line 14f, the seventh resistance line 14g and the eighth resistance line 14h, which facilitates the formation of the patterns. Moreover, the structure of the fifth light-emitting device 13e, the sixth light-emitting device 13f, the seventh light-emitting device 13g and the eighth light-emitting device 13h is axisymmetric about the third straight line NN', so that it may also be possible to ensure the distribution uniformity of the fifth light-emitting device 13e, the sixth light-emitting device 13f, the seventh light-emitting device 13g and the eighth light-emitting device 13h, and improve the luminance uniformity.

In some embodiments, as shown in FIG. 12, the plurality of power supply lines 12 further include a third power supply line 12c. The third power supply line 12c is parallel to the first power supply line 12a, and the third power supply line 12c is located on a side of the second power supply line 12b away from the first power supply line 12a and is adjacent to the second power supply line 12b. A fourth straight line CC' parallel to the first power supply line 12a and passing through the second coupling portion R is drawn on the substrate 11. The structure of all resistance lines 14 coupled to the second power supply line 12b is axisymmetric about the fourth straight line CC', and/or, the structure of all light-emitting devices 13 coupled to the second power supply line 12b is axisymmetric about the fourth straight line CC'.

In these embodiments, the structure of all the resistance lines 14 coupled to the second power supply line 12b is axisymmetric about the fourth straight line CC', so that it may also be possible to increase the distribution uniformity of all the resistance lines 14 coupled to the second power supply line 12b, and facilitate the manufacturing. In addition, in a case where the fifth resistance line 14e, the sixth resistance line 14f, the seventh resistance line 14g and the eighth resistance line 14h are all coupled to the second coupling portion R, eight resistance lines 14 distributed on two opposite sides of the second power supply line 12b may be coupled to the second coupling portion R. In this case, the eight resistance lines 14 may be coupled to the second coupling portion R through a single via hole O, and four resistance lines 14 in the eight resistance lines 14 distributed on the two opposite sides of the second power supply line 12b may share a same resistance segment. As shown in FIG. 12, the fifth resistance line 14e, the sixth resistance line 14f, a ninth resistance line 14i and a tenth resistance line 14j distributed on the two opposite sides of the second power supply line 12b share the same resistance segment 144. In this way, it is possible to further reduce the area occupied by the resistance lines 14, improve the distribution uniformity and regularity of the resistance lines 14, and facilitate manufacturing. The structure of all the light-emitting devices 13 coupled to the second power supply line 12b is axisymmetric about the fourth straight line CC', so that it may also be possible to ensure the distribution uniformity of the light-emitting devices 13 coupled to the second power supply line 12b, and improve the luminance uniformity.

Figure 13:
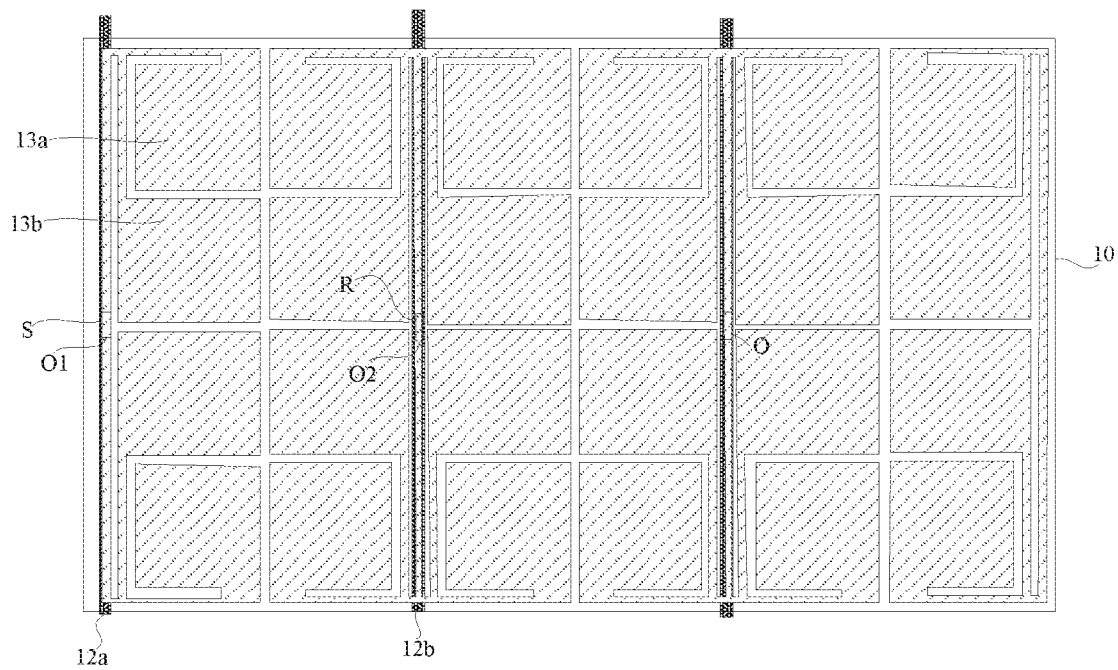
FIG. 13 is a top view of yet another light-emitting substrate, in accordance with some embodiments.

In some embodiments, as shown in FIG. 13, the plurality of via holes O in the insulating layer 10 include a first via hole O1 corresponding to a position of the first coupling portion S and a second via hole O2 corresponding to a position of the second coupling portion R, and a size of the second via hole O2 is substantially equal to a size of the first via hole O1.

In these embodiments, in conjunction with FIGS. 12 and 13, in a case where a structure of the first resistance segment 141 and the resistance segment 144 is axisymmetric about the second straight line WA, the resistance value of the first resistance segment 141 and the resistance value of the resistance segment 144 are substantially the same. Therefore, the size of the first via hole O1 is made substantially equal to the size of the second via hole O2, so that it may be possible to make a contact resistance between the first resistance segment 141 and the first coupling portion S substantially equal to a contact resistance between the resistance segment 144 and the second coupling portion R. As a result, it may be possible to ensure that currents provided for light-emitting devices 13 (e.g., all light-emitting devices 13 coupled the first power supply line 12a and all light-emitting devices 13 coupled to the second power supply line 12b) are substantially equal, thereby further improving the luminance uniformity.

Some embodiments of the present disclosure provide a method of manufacturing a light-emitting substrate. As shown in FIG. 2, the method includes the following steps.

A plurality of power supply lines 12, a plurality of light-emitting devices 13 and a plurality of resistance lines 14 are formed on the substrate 11. Each light-emitting device 13 includes a first electrode 131 and a second electrode 132 that are disposed sequentially, and a light-emitting functional layer 132 disposed between the first electrode 131 and the second electrode 132. The first electrode 131 is closer to the substrate 11 than the second electrode 132. An end of each resistance line 14 is coupled to a power supply line 12, and another end of each resistance line 14 is coupled to a first electrode 131 of a light-emitting device 13, and each resistance line 14 is located in a same layer as the first electrode 131 coupled thereto.

Beneficial effects of the method of manufacturing the light-emitting substrate provided by the embodiments of the present disclosure are the same as beneficial effects of the light-emitting substrate provided by the embodiments of the present disclosure, and details will not be repeated herein.

In some embodiments, the step of forming the first electrode 131 of each light-emitting device 13 in the plurality of light-emitting devices 13 and the step of forming the plurality of resistance lines 14 include: forming a conductive film, and patterning the conductive film to form a conductive pattern layer. The conductive pattern layer includes the first electrode 131 of each light-emitting device 13 in the plurality of light-emitting devices 13 and the plurality of resistance lines 14. That is, the first electrode 131 of each light-emitting device 13 in the plurality of light-emitting devices 13 and the plurality of resistance lines 14 are formed through a same patterning process.

Figure 14:
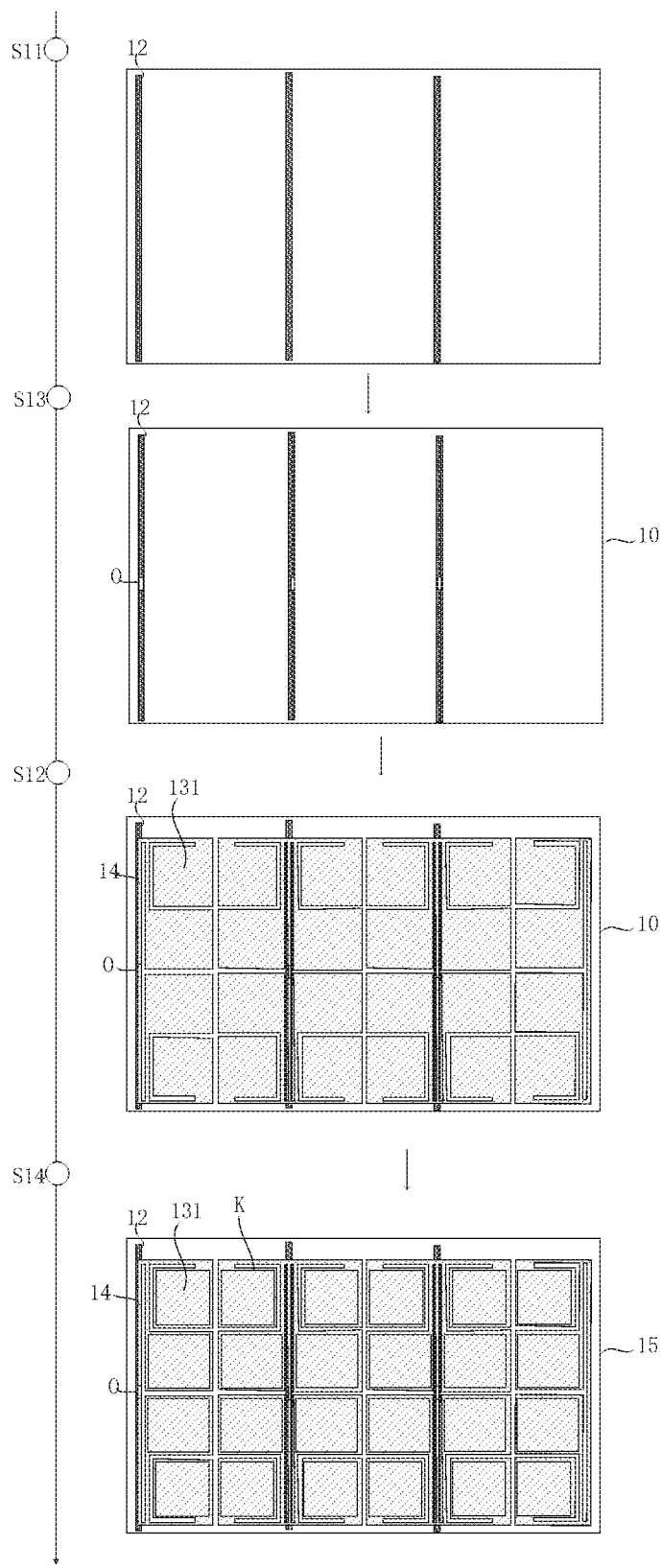
FIG. 14 is a flow diagram of a method for manufacturing a light-emitting substrate, in accordance with some embodiments.

It can be seen from that the light-emitting substrate 1 may further include the insulating layer 10 disposed between the plurality of power supply lines 12 and the first electrodes 131, as shown in FIG. 14, after S11 in which the plurality of power supply lines 12 are formed, and before S12 in which the first electrodes 131 are formed, the method further includes the following step.

In S13, a plurality of via holes O are formed in the insulating layer 10 on the substrate.

In this way, when the plurality of resistance lines 14 are formed, each resistance line 14 may be coupled to a power supply line 12 through a via hole O in the insulating layer 10.

In some embodiments, in a case where the light-emitting substrate 1 further includes a pixel defining layer 15, as shown in FIG. 14, the method further includes S14 after the first electrodes 131 are formed in S12 and before the light-emitting functional layer is formed, where in S14 the pixel defining layer 15 is formed. The pixel defining layer 15 defines a plurality of openings K. When the light-emitting functional layer is subsequently formed, the light-emitting functional layer of each light-emitting device 13 may be formed in an opening K.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
    a substrate;
    a plurality of power supply lines disposed on the substrate;
    a plurality of light-emitting devices disposed on the substrate; each light-emitting device including, in a direction perpendicular to the substrate, a first electrode and a second electrode that are disposed sequentially, and a light-emitting functional layer disposed between the first electrode and the second electrode in a direction perpendicular to the substrate; the first electrode being closer to the substrate than the second electrode; and
    a plurality of resistance lines, an end of each resistance line being coupled to a power supply line, another end of each resistance line being coupled to a first electrode of a light-emitting device, and each resistance line and the first electrode coupled thereto being disposed in a same layer;
    wherein the plurality of light-emitting devices include a plurality of lines of light-emitting devices arranged in a first direction, and light-emitting devices in each line of light-emitting devices are arranged in a second direction; the first direction intersects the second direction; and
    the plurality of power supply lines include a first power supply line and a second power supply line that extend in the second direction and are arranged adjacent to each other in the first direction; the first power supply line and the second power supply line are provided with at least one line of light-emitting devices therebetween, and a first electrode of each light-emitting device in the at least one line of light-emitting devices is coupled to the first power supply line or the second power supply line;
    wherein the plurality of light-emitting devices include a first light-emitting device and a second light-emitting device that are adjacent in the first direction or in the second direction;
    the plurality of resistance lines include a first resistance line and a second resistance line; and
    the first resistance line is coupled to a first electrode of the first light-emitting device, and the second resistance line bypasses at least one edge of the first electrode of the first light-emitting device and is coupled to a first electrode of the second light-emitting device.

2. The light-emitting substrate according to claim 1, wherein
    the second resistance line is adjacent to the first electrode of the first light-emitting device.

3. The light-emitting substrate according to claim 1, wherein the first light-emitting device and the second light-emitting device are located between the first power supply line and the second power supply line; and the first power supply line, the first light-emitting device, the second light-emitting device and the second power supply line are sequentially arranged in the first direction;
    the first electrode of the first light-emitting device is coupled to the second power supply line through the first resistance line, and the first electrode of the second light-emitting device is coupled to the first power supply line through the second resistance line; and the first resistance line bypasses at least one edge of the first electrode of the second light-emitting device and is coupled to the first electrode of the first light-emitting device.

4. The light-emitting substrate according to claim 3, wherein
    at least a part of the first resistance line and at least a part of the second resistance line are distributed on two opposite sides, arranged in the second direction, of a group of the first electrode of the first light-emitting device and the first electrode of the second light-emitting device in the second direction.

5. The light-emitting substrate according to claim 4, wherein
    an end of the first resistance line coupled to the first electrode of the first light-emitting device extends to an edge of the first electrode of the first light-emitting device proximate to the first power supply line;
    and/or
    an end of the second resistance line coupled to the first electrode of the second light-emitting device extends to an edge of the first electrode of the second light-emitting device proximate to the second power supply line.

6. The light-emitting substrate according to claim 1, wherein
    the first power supply line includes a first coupling portion;
    the first light-emitting device and the second light-emitting device are arranged in the second direction;
    the first resistance line includes a first resistance segment and a second resistance segment that are connected to each other, an end of the first resistance segment away from a connection point is coupled to the first coupling portion, and an end of the second resistance segment away from the connection point is coupled to the first electrode of the first light-emitting device, the connection point is a position where the first resistance segment is connected to the second resistance segment; and the second resistance line includes the first resistance segment and a third resistance segment connected to the connection point, and an end of the third resistance segment away from the connection point is coupled to the first electrode of the second light-emitting device.

7. The light-emitting substrate according to claim 6, wherein
an orthographic projection of the first resistance segment on the substrate and an orthographic projection of the first power supply line on the substrate have an overlapped region therebetween.

8. The light-emitting substrate according to claim 6, wherein
the first electrode of the first light-emitting device and the first electrode of the second light-emitting device are arranged side by side, and the first electrode of the second light-emitting device is adjacent to the first resistance segment; the second resistance segment extends in the first direction and is located on a side of the first electrode of the first light-emitting device away from the first electrode of the second light-emitting device; and the third resistance segment extends in the second direction and is located between the first resistance segment and the first electrode of the first light-emitting device.

9. The light-emitting substrate according to claim 8, wherein
an end of the second resistance segment coupled to the first electrode of the first light-emitting device extends to an edge of the first electrode of the first light-emitting device proximate to the second power supply line; and
an end of the third resistance segment coupled to the first electrode of the second light-emitting device extends to an edge of the first electrode of the second light-emitting device proximate to the first power supply line.

10. The light-emitting substrate according to claim 8, wherein
a dimension of the first electrode of the second light-emitting device in the first direction is greater than a dimension of the first electrode of the first light-emitting device in the first direction.

11. The light-emitting substrate according to claim 8, further comprising a pixel defining layer, wherein the pixel defining layer defines a plurality of openings, the plurality of openings include a first opening and a second opening, the first light-emitting device is disposed in the first opening, and the second light-emitting device is disposed in the second opening; and
a dimension of the second opening in the first direction is greater than a dimension of the first opening in the first direction.

12. The light-emitting substrate according to claim 6, wherein
the plurality of light-emitting devices further include a third light-emitting device and a fourth light-emitting device;
the plurality of resistance lines further include a third resistance line and a fourth resistance line; an end of the third resistance line is coupled to the first coupling portion, and another end of the third resistance line is coupled to a first electrode of the third light-emitting device; an end of the fourth resistance line is coupled to the first coupling portion, and another end of the fourth resistance line is coupled to a first electrode of the fourth light-emitting device;
about a first straight line, passing through the first coupling portion and perpendicular to the first power supply line, on a plane where the substrate is located, a structure of the first resistance line, the second resistance line, the third resistance line and the fourth resistance line is axisymmetric, and/or, a structure of the first light-emitting device, the second light-emitting device, the third light-emitting device and the fourth light-emitting device is axisymmetric.

13. The light-emitting substrate according to claim 6, wherein
the second power supply line includes a second coupling portion;
the plurality of light-emitting devices further include a fifth light-emitting device and a sixth light-emitting device;
the plurality of resistance lines further include a fifth resistance line and a sixth resistance line; an end of the fifth resistance line is coupled to the second coupling portion, and another end of the fifth resistance line is coupled to a first electrode of the fifth light-emitting device; an end of the sixth resistance line is coupled to the second coupling portion, and another end of the sixth resistance line is coupled to a first electrode of the sixth light-emitting device;
about a second straight line, parallel to both the first power supply line and the second power supply line and located between the first light-emitting device and the second light-emitting device, on a plane where the substrate is located, a structure of the first resistance line, the second resistance line, the fifth resistance line and the sixth resistance line is axisymmetric, and/or, a structure of the first light-emitting device, the second light-emitting device, the fifth light-emitting device and the sixth light-emitting device is axisymmetric.

14. The light-emitting substrate according to claim 13, wherein
the plurality of light-emitting devices further include a seventh light-emitting device and an eighth light-emitting device;
the plurality of resistance lines further include a seventh resistance line and an eighth resistance line;
an end of the seventh resistance line is coupled to the second coupling portion, and another end of the seventh resistance line is coupled to a first electrode of the seventh light-emitting device; an end of the eighth resistance line is coupled to the second coupling portion, and another end of the eighth resistance line is coupled to a first electrode of the eighth light-emitting device;
about a third straight line, passing through the second coupling portion and perpendicular to the second power supply line, on the plane where the substrate is located, a structure of the fifth resistance line, the sixth resistance line, the seventh resistance line and the eighth resistance line is axisymmetric, and/or, a structure of the fifth light-emitting device, the sixth light-emitting device, the seventh light-emitting device and the eighth light-emitting device is axisymmetric.

15. The light-emitting substrate according to claim 13, wherein
the plurality of power supply lines further include a third power supply line; the third power supply line is parallel to the first power supply line, and the third power supply line is located on a side of the second power supply line away from the first power supply line and is adjacent to the second power supply line;

about a fourth straight line, passing through the second coupling portion and parallel to the first power supply line, on the plane where the substrate is located, a structure of all resistance lines coupled to the second power supply line is axisymmetric, and/or, a structure of all light-emitting devices coupled to the second power supply line is axisymmetric.

16. The light-emitting substrate according to claim 13, wherein the plurality of power supply lines and the plurality of resistance lines are provided with an insulating layer therebetween, and the insulating layer is provided with a plurality of via holes therein;

the plurality of via holes include a first via hole corresponding to a position of the first coupling portion and a second via hole corresponding to a position of the second coupling portion, and a size of the second via hole is substantially equal to a size of the first via hole.

17. The light-emitting substrate according to claim 1, wherein each resistance line has substantially a same resistance value.

18. A light-emitting apparatus, comprising the light-emitting substrate according to claim 1.

* * * * *